(12) United States Patent
Lee et al.

(10) Patent No.: US 7,468,929 B2
(45) Date of Patent: Dec. 23, 2008

(54) APPARATUS FOR SRAM ARRAY POWER REDUCTION THROUGH MAJORITY EVALUATION

(75) Inventors: Michael J. Lee, Austin, TX (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/609,382

(22) Filed: Dec. 12, 2006

(65) Prior Publication Data

US 2008/0137450 A1 Jun. 12, 2008

(51) Int. Cl.
*G11C 5/14* (2006.01)
(52) U.S. Cl. .................. 365/227; 365/189.07; 365/154
(58) Field of Classification Search .................. 365/227, 365/189.07, 154
See application file for complete search history.

(56) References Cited

U.S. PATENT DOCUMENTS

2005/0018519 A1* 1/2005 Nii ............................ 365/227

FOREIGN PATENT DOCUMENTS

JP 2002366419 A * 12/2002

OTHER PUBLICATIONS

Chang et al., "Conforming Block Inversion for Low Power Memory", IEEE, Transactions on Very Large Scale Integration (VLSI) Systems, vol. 10, No. 1, Feb. 2002, pp. 15-19.

* cited by examiner

*Primary Examiner*—Hoai V. Ho
*Assistant Examiner*—Fernando N Hidalgo
(74) *Attorney, Agent, or Firm*—Stephen J. Walder, Jr.; Diana R. Gerhardt

(57) ABSTRACT

A mechanism for reducing the amount of power or energy consumed by an SRAM array when the SRAM array is being accessed is provided. Logic is provided that identifies a polarity of a row of memory cells whose data values are to be read. The polarity of the row of memory cells indicates whether a majority of the data values stored in the row of memory cells are logic 1 data values or logic 0 data values. Based on the polarity, selection logic either selects true data values or complement data values of the memory cells. Additional logic is provided in each memory cell for outputting a true data value to a read bit line and outputting a compliment data value to the read bit line based on the polarity.

12 Claims, 9 Drawing Sheets

APPARATUS FOR SRAM ARRAY POWER REDUCTION THROUGH MAJORITY EVALUATION

BACKGROUND

1. Technical Field

The present application relates generally to an improved data processing device and method. More specifically, the present application is directed to an apparatus and method for static random access memory (SRAM) array power reduction through majority evaluation.

2. Description of Related Art

Static random access memory (SRAM) is a type of semiconductor memory utilized in modern data processing devices. The term "static" indicates that SRAM is a memory type that retains its contents as long as power remains applied, unlike dynamic RAM (DRAM) that needs to be periodically refreshed. Nevertheless, SRAM should not be confused with read-only memory (ROM) and flash memory, since it is volatile memory and preserves data only while power is continuously applied. The term "random access" means that locations in the memory can be written to or read from in any order, regardless of the memory location that was last accessed.

In a typical architecture, each bit in an SRAM cell is stored on four transistors that form two cross-coupled inverters. This SRAM cell has two stable states which are used to denote 0 and 1 data values. Two additional access transistors serve to control the access to a storage cell during read and write operations. It thus typically takes six metal-oxide-semiconductor field-effect transistors (MOSFETs) to store one memory bit.

FIG. 1 is an exemplary diagram of a known six transistor (6T) SRAM cell. Access to the SRAM cell 100 is enabled by the wordline (WL) 110 which controls the two access transistors 120 and 130. The two access transistors 120 and 130 control whether the memory cell 100 should be connected to bit lines BL 140 and BL' 150. The bit lines BL 140 and BL' 150 are used to transfer data for both read and write operations. The memory cell 100 further includes two inverters 160 and 170 which each comprise two transistors (not shown). The two transistors of each inverter 160 and 170 along with the access transistors 120 and 130 constitute the six transistors of the 6T SRAM cell structure. An SRAM memory array, comprising rows and columns of such SRAM cells 100, is typically used to provide a SRAM memory for a data processing device.

An SRAM cell 100 has three possible states: standby, read, and write. In a standby state, a signal along the wordline 110 is not asserted. As a result, the access transistors 120 and 130 disconnect the SRAM cell 100 from the bit lines BL 140 and BL' 150. The two cross coupled inverters 160 and 170 continue to reinforce each other as long as they are disconnected from the bit lines BL 140 and BL' 150.

In a read state, the bit lines BL 140 and BL' 150 are precharged to a logical "1" or high voltage state. A signal along the wordline 110 is then asserted thereby enabling both of the access transistors 120 and 130. Assuming that the SRAM cell 100 stores a logic "1" value as Q, the values in the inverters 160 and 170, i.e. Q and Q', are transferred to the bit lines BL 140 and BL' 150 by leaving BL 140 at its precharged value and discharging BL' 150, through the access transistor 130 and the NFET of inverter 160, to a logical "0" or low voltage state. On the BL 140 side, the voltage of bit line BL 140 is pulled towards VDD, i.e. a logical "1" or high voltage state, by the access transistor 130 and a PFET of inverter 170.

If the content of the SRAM cell were a logic "0", i.e. Q=0, the opposite situation would occur with the bitline BL' 150 being pulled toward a logic "1" or high voltage state and bit line BL 140 being discharged towards a logic "0" or low voltage state.

The start of a write cycle begins by applying the value to be written to the bit lines BL 140 and BL' 150. If a 0 value is to be written to the SRAM cell 100, a 0 value is applied to the bit lines, i.e. setting bitline BL' 150 to a logic "1" or high voltage state and bitline BL 140 to a logic "0" or low voltage state. A 1 value may be written to the SRAM cell 100 by inverting the values of the bit lines BL 140 and BL' 150. A signal along the wordline 110 is then asserted and the value that is to be stored is latched-in to the SRAM cell 100.

It should be noted that the reason this technique works is that the bit line input-drivers are designed to be much stronger than the relatively weak transistors in the SRAM cell 100 itself, so that they can easily override the previous state of the cross-coupled inverters 160 and 170. Careful sizing of the transistors in a SRAM cell 100 is needed to ensure proper operation.

Another known SRAM cell architecture makes use of eight transistors, i.e. an 8T SRAM cell, as shown in FIG. 2. In the eight transistor SRAM cell architecture, the write operation is performed in an identical manner as in the 6T SRAM cell described above with regard to FIG. 1. However, with this architecture, the bitlines BL 240 and BL' 250 are not used for reading values from the SRAM cell 200.

To the contrary, in order to read from the 8T SRAM cell 200, a read bit line RBL 280 is provided and is precharged to a logic "1" or high voltage state. A read wordline 260 signal is then asserted causing the read port rp<n> to be enabled for all the SRAM cells 200 in a target row of the SRAM cell array. Based on the SRAM cell 200 contents, the read bit line RBL 280 is left in the precharge state, i.e. a logic "1" or high voltage state, or is discharged to a logic "0" or low voltage state. For example, if the content of the SRAM cell 200 is a "1" data value, then the read bit line RBL 280 is kept at a precharged state. If the content of the SRAM cell 200 is a "0" data value, the read bit line RBL 280 is discharged to a logic "0" or low voltage state. Depending on the speed at which the SRAM cell 200 can discharge the read bit line RBL 280, the read bit line RBL 280 holds the value of the target SRAM cell after the wordline signal is asserted and before the next precharge pulse clears the read bit line RBL 280.

The act of charging and discharging a bit line during a read operation consumes a large amount of energy in an SRAM array. Thus, it would be beneficial to reduce the amount of energy consumed by the SRAM array during accesses of the SRAM array.

SUMMARY

The illustrative embodiments provide a mechanism for reducing the amount of power or energy consumed by an SRAM array when the SRAM array is being accessed. The consumed energy or power is reduced by the mechanisms of the illustrative embodiments by minimizing the number of read bit lines (RBLs) in a SRAM cell array that need to be discharged and subsequently precharged. This minimization is made possible by circuitry that performs a majority function of each array row and uses the resulting information to decrease the number of read bit line (RBL) discharges during a read operation in a SRAM cell array.

With the illustrative embodiments, logic is provided for determining the polarity of an incoming row being written to the SRAM cell array. Logic is further provided for storing a polarity value into an additional SRAM cell per row of the SRAM cell array. Logic is also provided for reading an inverted value of the SRAM cells of a row in the SRAM cell array if the row contains more 0's than 1's, as determined based on the polarity value stored in the additional SRAM cell per row. Logic is further provided for signaling to downstream logic whether the data read from the SRAM cells in the row represents the true data values or their complement, as determined based on the polarity value stored in the additional SRAM cell per row.

In one illustrative embodiment, a polarity detector is provided that detects whether the majority of data values written to a row of SRAM cells in the SRAM cell array are "1" or "0" data values. If the majority of data values are "1" data values, the polarity detector outputs a "1" polarity value that is stored in the additional SRAM cell of the row. If the majority of data values are "0" data values, the polarity detector outputs a "0" polarity value that is stored in the additional SRAM cell of the row.

The additional SRAM cell of each row further provides input signals to the SRAM cells of the row with which it is associated during a read operation. Based on the polarity value stored in this additional SRAM cell, either the true data values or their complements are output by the SRAM cells of the row. Whether to output the true data values or their complements is determined by the polarity which indicates whether outputting the true data values or the complements would result in lower power consumption. For example, if the polarity indicates that there are more 0 data values stored in the SRAM cells of the row, then outputting the complement would require less power since not as many read bit lines would need to be discharged. However, if the polarity indicates that there are more 1 data values stored in the SRAM cells of the row, then outputting the true data values would require less power since not as many read bit lines would need to be discharged.

Logic is further provided that informs multiplexers downstream of the SRAM cells whether or not the complement data values or the true data values are output by the SRAM cells. This logic essentially provides a select signal to the multiplexers based on the determined polarity of the row of SRAM cells. The multiplexers may then select whether to output the actual output of the SRAM cells or a complement of the actual output of the SRAM cells.

It should be appreciated that the "actual" data value may in fact be either the true data value or the complement of the true data value that was to be written to the SRAM cell based on the determined polarity of the row of SRAM cells. That is, if the true data value is output by the SRAM cells because the polarity is determined to be a "1" value, then the "actual" data values are the true data values stored in the SRAM cells. If the complement of the true data value is output by the SRAM cells because the polarity is determined to be a "0" value, then the "actual" data values are the complement of the true data values stored in the SRAM cells.

Thus, the selected data value output by the mechanisms of the illustrative embodiments may be either the true data value or the complement of the stored complement data value in the SRAM cell, depending upon the polarity of the row of SRAM cells. In either case, the true data value is selected as the data value that is output as the SRAM cell data value for the SRAM array.

In one illustrative embodiment, the additional SRAM cell of each row may provide a select signal to multiplexers of the polarity detector provided in association with each column of the SRAM cell array. These multiplexers determine whether the true data value or the complement of the true data value is stored in the SRAM cells of a row of SRAM cells in the SRAM array. The select signal sent to the multiplexers of the polarity detector are determined based on the polarity value stored in the additional SRAM cell.

The select signal selects either the true data value or its complement to be stored in respective SRAM cells of a row in the SRAM cell array. In this illustrative embodiment, if the majority of data values are "0" data values, the polarity detector sends a select signal to the multiplexers to select the complement of the true data values to be stored in the SRAM cells in the row of SRAM cells. If the majority of data values are "1" data values, the polarity detector sends a select signal to the multiplexers to select the true data values to be stored in the SRAM cells in the row of SRAM cells.

With this illustrative embodiment, the SRAM cells themselves do not require any additional logic for determining whether to output the true data value or a complement of the true data value, as in the previously described embodiment. To the contrary, the SRAM cells output whatever data value is stored in the SRAM cells since the determination as to whether to use the true data value or the complement of the true data value was made by the polarity detector when writing the data values to the SRAM cells.

Multiplexers are provided at the output of the SRAM array to select whether to output the actual data values output by the SRAM cells or the complement of the data values output by the SRAM cells. The operation of these multiplexers is similar to the previously described embodiment. If the polarity of the row of SRAM cells is a "1," then the actual data values output by the SRAM cells may be selected for output by the SRAM array. If the polarity of the row of SRAM cells is a "0," then the complement of the actual data values output by the SRAM cells may be selected for output by the SRAM array.

In one illustrative embodiment a method for reading data from a memory array comprising a plurality of memory cells is provided. The method may comprise identifying a polarity of a row of memory cells whose data values are to be read from the memory array. The method may further comprise selecting whether to output true data values from the memory cells of the row of memory cells or complement data values from the memory cells of the row of memory cells based on the identified polarity. One of the true data values or the complement data values may be output from the memory cells of the row of memory cells as the data read from the memory array based on the selection.

The polarity of the row of memory cells may indicate whether a majority of the data values stored in the row of memory cells are logic 1 data values or logic 0 data values. If the polarity of the row of memory cells indicates that a majority of the data values stored in the row of memory cells are logic 1 data values, then the true data values of the memory cells in the row of memory cells may be selected for output by the memory array. If the polarity of the row of memory cells indicates that a majority of the data values stored in the row of memory cells are logic 0 data values, then the complement data values of the memory cells in the row of memory cells may be selected for output by the memory array.

The method may further comprise receiving data values to be written to the row of memory cells and determining a polarity value of the row of memory cells based on the data values to be written to the row of memory cells. The polarity value may be stored in association with the row of memory cells. The polarity value may be used to identify the polarity of the row of memory cells.

The method may further comprise receiving data values to be written to the row of memory cells and identifying a polarity value of the row of memory cells based on the data values to be written to the row of memory cells. Moreover, the method may comprise determining whether to write the data values or complement data values to the row of memory cells based on the polarity value and writing one of the data values or the complement data values to the row of memory cells based on results of the determination.

Selecting whether to output true data values from the memory cells of the row of memory cells or complement data values from the memory cells of the row of memory cells based on the identified polarity may comprise selecting whether to output an actual data value output by the memory cells or a complement of the actual data value output by the memory cells based on the identified polarity of the row of memory cells. The actual data value or the complement of the actual data value may be the true data value based on whether true data values or complements of the true data values are written to the memory cells.

The memory array may be, for example, a static random access memory (SRAM) cell array. Moreover, the memory cells may be one of a six transistor static random access memory (SRAM) cell or an eight transistor SRAM cell. The memory array may be part of an integrated circuit chip.

In yet another illustrative embodiment, a memory array is provided. The memory array may comprise a plurality of memory cells arranged in an array configuration having at least one row of memory cells and logic that identifies a polarity of a row of memory cells whose data values are to be read from the memory array. The memory array may further comprise selection logic that selects whether to output true data values from the memory cells of the row of memory cells or complement data values from the memory cells of the row of memory cells based on the identified polarity. Moreover the memory array may comprise output logic that outputs one of the true data values or the complement data values from the memory cells of the row of memory cells as the data read from the memory array based on the selection.

The polarity of the row of memory cells indicates whether a majority of the data values stored in the row of memory cells are logic 1 data values or logic 0 data values. If the polarity of the row of memory cells indicates that a majority of the data values stored in the row of memory cells are logic 1 data values, then the selection logic may select the true data values of the memory cells in the row of memory cells for output by the memory array. If the polarity of the row of memory cells indicates that a majority of the data values stored in the row of memory cells are logic 0 data values, then the selection logic may select the complement data values of the memory cells in the row of memory cells for output by the memory array.

The memory array may further comprise logic that receives data values to be written to the row of memory cells. Moreover, the memory array may comprise polarity detection logic that determines a polarity value of the row of memory cells based on the data values to be written to the row of memory cells. The memory array may also comprise logic that stores the polarity value in association with the row of memory cells. The polarity value may be used to identify the polarity of the row of memory cells.

The memory array may comprise logic that receives data values to be written to the row of memory cells and polarity detection logic that detects a polarity value of the row of memory cells based on the data values to be written to the row of memory cells. The memory array may further comprise determination logic that determines whether to write the data values or complement data values to the row of memory cells based on the polarity value. Moreover, the memory array may comprise write logic that writes one of the data values or the complement data values to the row of memory cells based on results of the determination.

The selection logic may select whether to output true data values from the memory cells of the row of memory cells or complement data values from the memory cells of the row of memory cells based on the identified polarity by selecting whether to output an actual data value output by the memory cells or a complement of the actual data value output by the memory cells based on the identified polarity of the row of memory cells. The actual data value or the complement of the actual data value may be the true data value based on whether true data values or complements of the true data values are written to the memory cells.

The memory cells in the memory array may be static random access memory (SRAM) cells. Moreover the memory cells of the memory array may be one of six transistor static random access memory (SRAM) cells or eight transistor SRAM cells.

In another illustrative embodiment, a data processing device comprising a processor and a memory coupled to the processor is provided. The memory may comprise a plurality of memory cells including at least one row of memory cells. The memory may comprise logic that identifies a polarity of a row of memory cells whose data values are to be read from the memory array. Moreover the memory may comprise logic that selects whether to output true data values from the memory cells of the row of memory cells or complement data values from the memory cells of the row of memory cells based on the identified polarity. Furthermore, the memory may comprise logic that outputs one of the true data values or the complement data values from the memory cells of the row of memory cells as the data read from the memory array based on the selection.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 4A-4D are exemplary diagrams illustrating possible configurations of a SRAM cell array to illustrate the benefit of majority evaluation;

DETAILED DESCRIPTION OF THE ILLUSTRATIVE EMBODIMENTS

The illustrative embodiments provide an apparatus and method for static random access memory (SRAM) array power reduction through majority evaluation. Such SRAM arrays have various uses depending upon the data processing device in which they are utilized. As one example, however, such SRAM arrays may be utilized in caches and local memories associated with processors in data processing devices.

Figure 3:
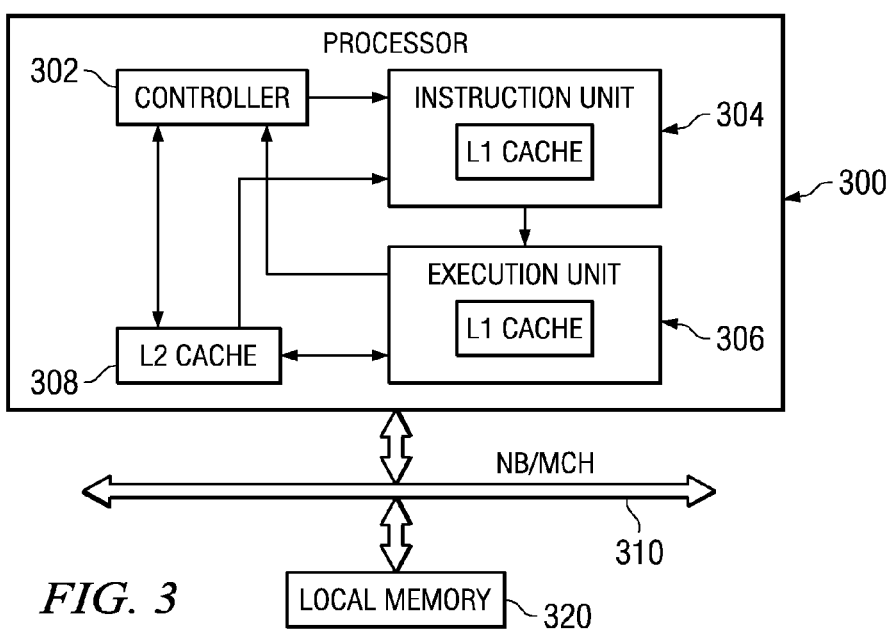
FIG. 3 is an exemplary block diagram of a processor in accordance with one illustrative embodiment.

FIG. 3 is provided as one example of a data processing environment in which a SRAM array may be utilized, i.e. in a cache or local memory of a processor. FIG. 3 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a SRAM array may be utilized is intended to be within the spirit and scope of the present invention.

Referring now to FIG. 3, an exemplary block diagram of a processor 300 is provided in accordance with one illustrative embodiment. Processor 300 includes controller 302, which controls the flow of instructions and data into and out of processor 300. Controller 302 sends control signals to instruction unit 304, which includes an L1 cache. Instruction unit 304 issues instructions to execution unit 306, which also includes an L1 cache. Execution unit 306 executes the instructions and holds or forwards any resulting data results to, for example, L2 cache 308. In turn, execution unit 306 retrieves data from L2 cache 308 as appropriate. Instruction unit 304 also retrieves instructions from L2 cache 308 when necessary. Controller 302 sends control signals to control storage or retrieval of data from L2 cache 308. Processor 300 may contain additional components not shown, and is merely provided as a basic representation of a processor and does not limit the scope of the present invention.

The processor 300 may obtain data/instructions from a local memory 320 via a north bridge and memory controller hub (NB/MCH) 310. The data/instructions from the local memory 320 may be loaded into the L2 cache 308 for quick and efficient access by the controller 302, instruction unit 304, and execution unit 306.

Those of ordinary skill in the art will appreciate that the hardware in FIG. 3 may vary depending on the implementation. Other internal hardware or peripheral devices, such as flash memory, equivalent non-volatile memory, or optical disk drives and the like, may be used in addition to or in place of the hardware depicted in FIG. 3. Also, the processes of the illustrative embodiments may be applied to a multiprocessor data processing system, other than the SMP system mentioned previously, without departing from the spirit and scope of the present invention.

Moreover, the data processing system 300 may take the form of any of a number of different data processing systems including client computing devices, server computing devices, a tablet computer, laptop computer, telephone or other communication device, a personal digital assistant (PDA), or the like. In some illustrative examples, data processing system 300 may be a portable computing device which is configured with flash memory to provide non-volatile memory for storing operating system files and/or user-generated data, for example. Essentially, data processing system 300 may be any known or later developed data processing system without architectural limitation.

The L1 cache, L2 cache 308, and/or local memory 320 may be implemented using SRAM cell arrays in accordance with the illustrative embodiments, for example, as will be described hereafter. As mentioned above, the precharging and discharging of the SRAM cells in an SRAM cell array requires a significant amount of power consumption. The illustrative embodiments herein reduce this power consumption by minimizing the amount of precharging and discharging associated with reading and/or writing data values to SRAM cells in an SRAM cell array. While the illustrative embodiments will be described with regard to an eight transistor SRAM cell architecture in which read bit lines (RBLs) are provided for reading data values from the SRAM cells, it should be appreciated that the illustrative embodiments are not limited to such. Rather, the benefits achieved by the mechanisms of the illustrative embodiments may be obtained through implementation of the illustrative embodiments using other types of SRAM cell architectures as well.

To better understand the underlying basis for the technique used by the illustrative embodiments to reduce power consumption of an SRAM cell array, reference is made to an exemplary array of SRAM cells as shown in FIGS. 4A-4D. The diagrams in FIGS. 4A-4D are not exhaustive of the possible configurations of data values stored in SRAM cells of an SRAM cell array but are chosen to illustrate the benefit of performing a majority evaluation in accordance with the illustrative embodiments.

In the diagrams of FIGS. 4A-4D, each box represents a single SRAM cell with the SRAM cells being arranged in rows and columns, as is generally known with regard to SRAM cell arrays. The examples shown in FIGS. 4A-4D are for a 5×5 SRAM cell array, but the actual SRAM cell array would of course include a great deal more SRAM cells than those depicted in FIGS. 4A-4D. Moreover, it should be appreciated that the description of these diagrams and the other SRAM cell diagrams set forth hereafter assume a pre-charge high and discharge low implementation. However, the illustrative embodiments are not limited to such and other exemplary embodiments may include a pre-charge low and discharge high implementation.

Figures 4A, 4B, 4C, 4D:
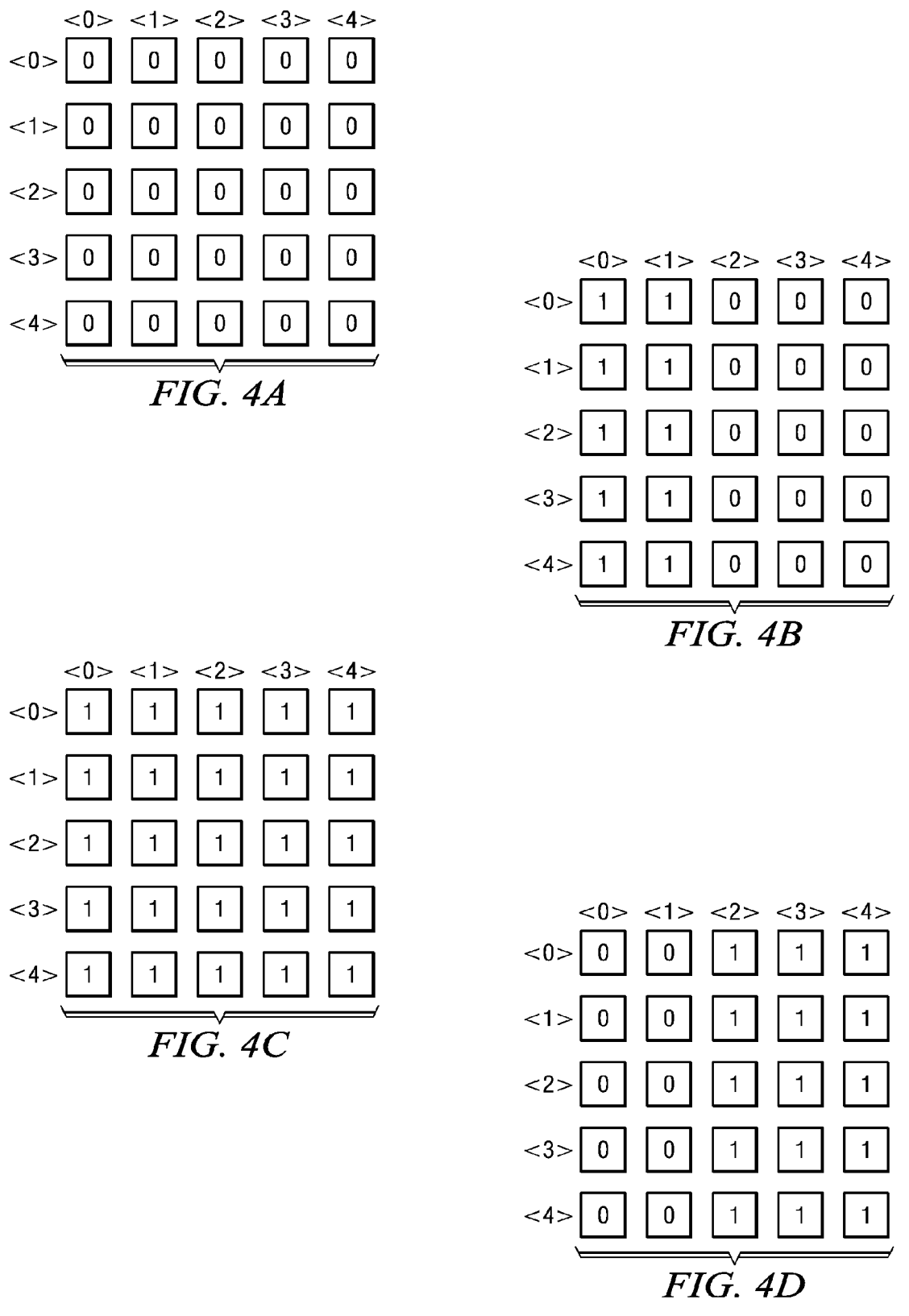

FIG. 4A illustrates a first configuration of the 5×5 SRAM cell array in which each of the SRAM cells stores a 0 data value. In such a configuration, when reading the data values of the SRAM cells, every SRAM cell would require its read bit line (RBL) to be discharged in order to read the 0 data value stored in the SRAM cell. Such discharging and subsequent precharging of the cells requires a significant amount of power consumption to be performed. Thus, it would be beneficial to reduce this amount of power consumption.

FIG. 4B illustrates a second configuration of the 5×5 SRAM cell array in which a portion of the SRAM cell array, i.e. the first two columns, are populated with 1 data values and the remainder of the SRAM cell array stores 0 data values. In this configuration, three out of the 5 read bit lines (RBLs) would need to be discharged for a read operation. Thus, a significant amount of power consumption is still present in this configuration.

FIG. 4C illustrates a third configuration of the 5×5 SRAM cell array in which all of the SRAM cells in the SRAM cell array store 1 data values. This configuration requires the least amount of power consumption since none of the read bit lines (RBLs) need to be discharged and subsequently pre-charged in order to perform the read operation. Thus, it would be best to approximate this configuration as much as possible during read operations of the SRAM cell array.

FIG. 4D illustrates a fourth configuration of the 5×5 SRAM cell array in which a portion of the SRAM cell array, i.e. the first two columns, are populated with 0 data values and the remainder of the SRAM cell array stores 0 data values. In other words, the configuration of FIG. 4D is the complement to the configuration shown in FIG. 4B. With this configuration, only 2 of the 5 read bit lines (RBLs) would need to be discharged for a read operation. Thus, this configuration in FIG. 4D requires more power consumption than the configuration shown in FIG. 4C due to the need to discharge the RBLs of the first two SRAM cells of a row in order to perform a read operation of an SRAM cell array row. However, this configuration in FIG. 4D requires less power consumption than the configuration shown in FIG. 4B, due to the smaller number of RBLs that must be discharged and subsequently pre-charged.

From FIGS. 4A-4D it can be seen that if the number of discharges of RBLs that are needed for a read operation may be minimized, the power consumption for performing such read operations may be minimized. One way to minimize the number of discharges of RBLs is to minimize the number of 0 data values read from the SRAM cells in the SRAM cell array. For example, by using a majority evaluation/programming scheme in accordance with the mechanisms of the illustrative embodiments, a SRAM cell array that is programmed to have a configuration such as shown in FIG. 4B may be read as if it had a configuration such as shown in FIG. 4D. In this way, the number of discharges of RBLs is minimized, leading to a minimization of the power consumption in the SRAM cell array.

With the mechanisms of the illustrative embodiments, logic is provided for determining the polarity of an incoming row being written to in a SRAM cell array. Logic is further provided for storing a polarity value into an additional SRAM cell per row of the SRAM cell array. Logic is also provided for reading an inverted value of the SRAM cells of a row in the SRAM cell array if the row contains more 0's than 1's, as determined based on the polarity value stored in the additional SRAM cell per row. Logic is further provided for signaling to downstream logic whether the data read from the SRAM cells in the row represents the true data values or their complement, as determined based on the polarity value stored in the additional SRAM cell per row.

Figure 5:
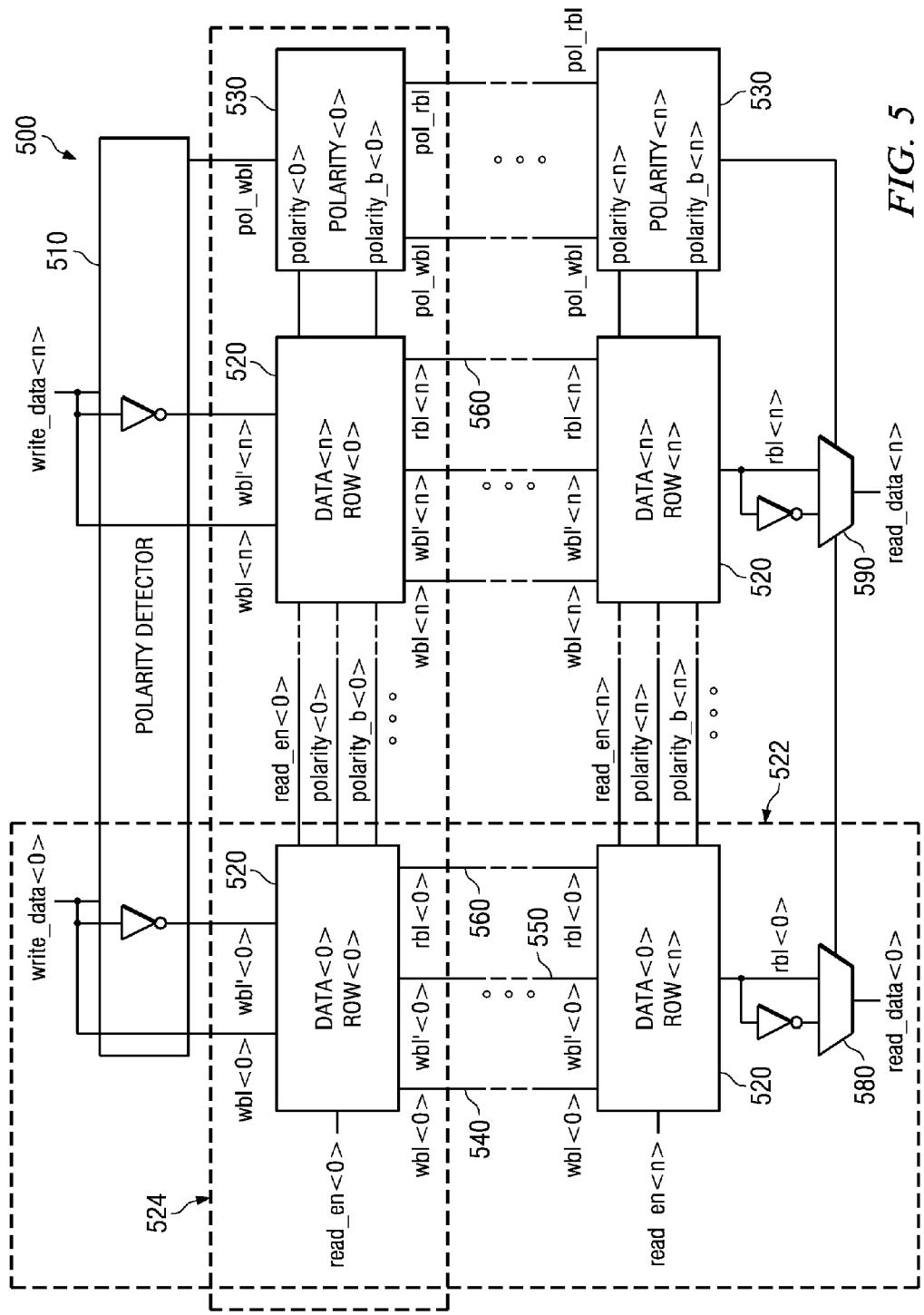
FIG. 5 is an exemplary diagram of a SRAM cell array in accordance with one illustrative embodiment.

FIG. 5 is an exemplary diagram of a SRAM cell array in accordance with one illustrative embodiment. As shown in FIG. 5, the SRAM cell array 500 includes a polarity detector 510, a plurality of SRAM cells 520 arranged as an array having columns 522 and rows 524, and a set of polarity cells 530, one polarity cell 530 for each row in the SRAM cell array 500. When data is written to the SRAM cell array 500, via the write_data<0:N> lines, the write line data has a sink in the polarity detector 510 as well as the bit line drivers (not shown) which determine the wbl<0:n> and wbl'<0:n> values propagated along the write bit lines wbl 540 and wbl' 550 for each column 522 of the SRAM cell array 500.

The polarity detector 510 receives the data values to be written to a row 524 of the SRAM cell array 500 and determines whether the set of data values for the row 524 contains more logic 1's than 0's. If there are more logic 1's than 0's in the data to be written to the row 524, the polarity detector 510 writes a logic 1 to the polarity cell 530 corresponding to the row 524 in the SRAM cell array 500 to which the data is being written. If the there are more logic 0's than 1's in the data, the polarity detector 510 writes a logic 0 to the polarity cell 530 corresponding to the row 524 in the SRAM cell array 500 to which the data is being written. A write_enable signal may be sent to the particular row 524 to enable the writing of the data values into the particular SRAM cells 520 and the polarity cell 530 of the row 524.

The polarity cell 530 has two outputs to the SRAM cells 520 of the corresponding row 524, i.e. polarity<0:n> and polarity_b<0:n>. These outputs along with the read enable signal determine whether a true data value or complement data value of the SRAM cell 520 is output on the read bit line (RBL) of the SRAM cell 520. Thus, if the polarity<0:n> output is at a logic high level, i.e. a logic 1, meaning that the polarity value stored in the polarity cell 530 is a 1, and the read enable signal is asserted, then the true data value stored in the SRAM cells 520 of the row 524 are output onto the read bit lines (RBLs) of the SRAM cells 520. If the polarity<0:n> output is at a logic low level, i.e. a logic 0, meaning that the polarity value stored in the polarity cell 530 is a 0, and the read enable signal is asserted, then the complement data value stored in the SRAM cells 520 of the row 524 are output onto the read bit lines (RBLs) of the SRAM cells 520. As a result, the number of 0's read during the read operation is minimized, thereby reducing the amount of discharging and pre-charging of the RBLs required to read data from the SRAM cell array 500.

During a read operation, the polarity cell 530 of a row 524 is read in a similar manner as the SRAM cells 520 of that row 524. A polarity read bit line (pol_rbl) 532 is provided for this purpose. The value of the polarity cell 530 for the row 524 is used as a select signal to multiplexers 580, 590. A multiplexer 580, 590 is provided for each column 522 in the SRAM cell array 500. The multiplexers 580, 590 select between a read bit line (RBL) value or its inverted, i.e. complement, value based on the selection signal from the polarity cell 530.

That is, if the polarity value in the polarity cell 530 is a 0, then the SRAM cell 520 will output the complement data value on its read bit line (RBL) 560. The complement data value is provided to the multiplexer 580, 590 along with the inverted data value, which in this case would be the true data value. The select signal to the multiplexer 580, 590 will be a logic 0, thereby selecting the inverted data value input to the multiplexer 580, 590 as the output from the multiplexer 580, 590. Thus, as a result, the true data value stored in the SRAM cell 520 is output by the multiplexer 580, 590.

If the polarity value in the polarity cell 530 is a 1, then the SRAM cell 520 will output the true data value on its read bit line (RBL) 560. The true data value is provided to the multiplexer 580, 590 along with the inverted data value, which in this case would be the complement data value. The select signal to the multiplexer 580, 590 will be a logic 1, thereby selecting the true data value input to the multiplexer 580, 590 as the output from the multiplexer 580, 590. Thus, again, the true data value stored in the SRAM cell 520 is output by the multiplexer 580, 590.

Thus, regardless of the polarity of the rows 524 of the SRAM cell array 500, the true data values of the SRAM cells 520 are output by the multiplexers 580, 590. The power savings of the illustrative embodiments is achieved by selecting whether the SRAM cells 520 themselves will output the true data value or its complement on their read bit lines 560 depending upon which option minimizes the amount of discharges of read bit lines 560 that are required to read the data from the SRAM cells 520 of a row 524. While the illustrative embodiments add two polarity read bit lines that must be charged and discharged, the addition of these two polarity bit lines increases the power consumption by an insignificant amount when compared to the power savings obtained from reducing the amount of discharging and pre-charging in large SRAM cell arrays. Hence, the mechanisms of the illustrative embodiments achieve correct operation of the SRAM cell array 500 while still minimizing power consumption of the SRAM cell array 500.

Figure 6:
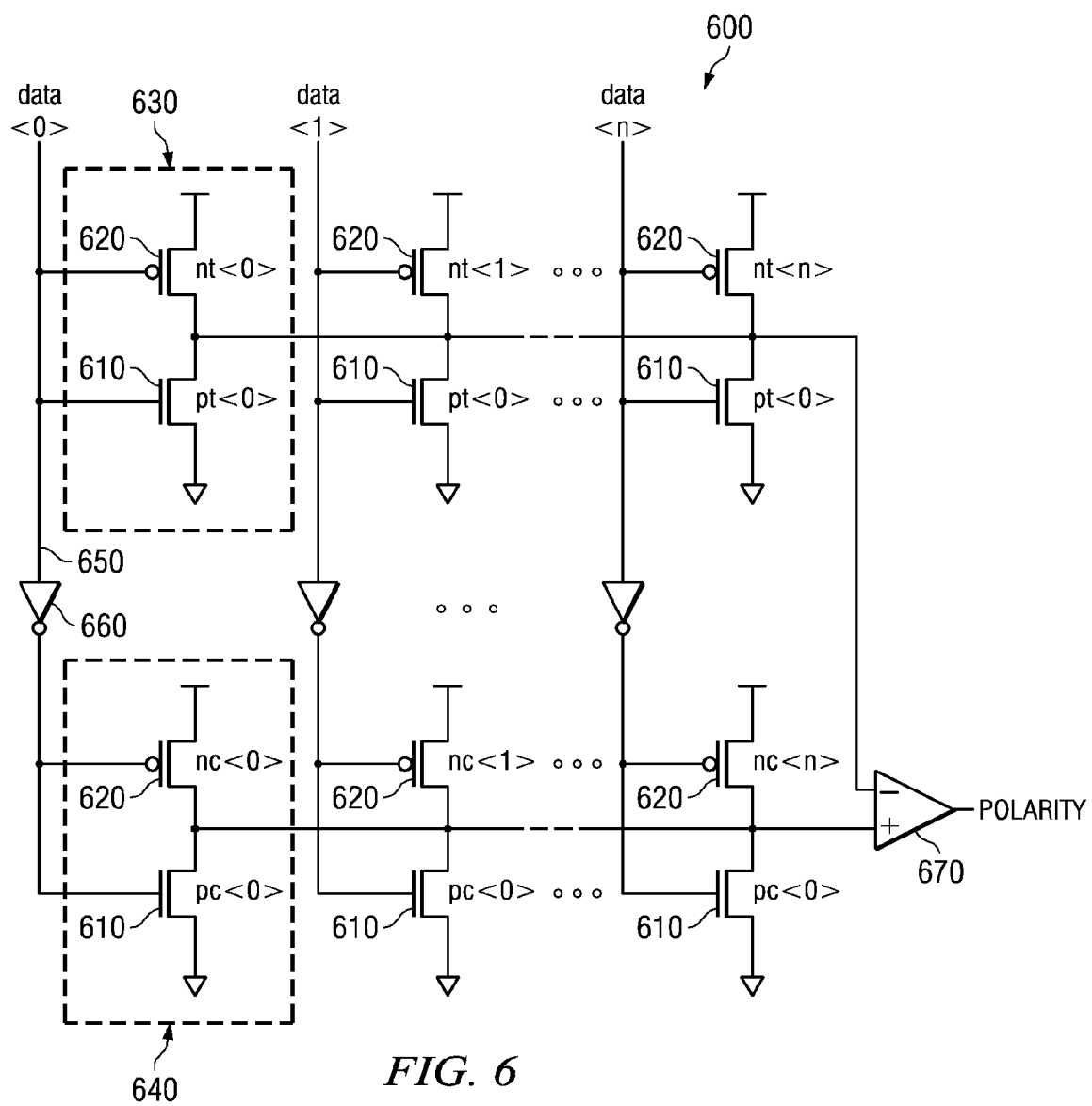
FIG. 6 is an exemplary diagram of circuitry of a polarity detector in accordance with one illustrative embodiment.

FIG. 6 is an exemplary diagram of circuitry of a polarity detector in accordance with one illustrative embodiment. As shown in FIG. 6, the polarity detector 600 is comprised of a plurality of PFETs 610 and NFETS 620. Pairs of PFETs 610 and NFETs 620 comprise inverters 630 and 640 which are coupled in parallel to a write_data line 650. Each write data line 650 includes an inverter 660 between couplings to the inverters 630 and 640. It is assumed, for purposes of this description, that all of the PFETs 610 are of the same size. Moreover, it is assumed, for purposes of this description, that all of the NFETs 620 are of the same size.

The inverters 630 of each write data line are coupled in series with one another. Similarly, the inverters 640 of each data line are coupled in series with one another. Furthermore, each series of inverters 630 and 640 are coupled to respective inputs of a comparator 670. The comparator receives inputs from the two series of inverters 630 and 640 and outputs a polarity signal for storing a polarity value in a corresponding polarity cell associated with a row of the SRAM cell array.

In operation, if the write_data value has a logic 1 state, the inverters 630 output a logic 0 value, or low voltage state signal. If the write_data value has a logic 0 state, the inverters 630 output a logic 1 value, or high voltage state signal. Because of the inverters 660 the opposite operation is achieved by the inverters 640 which output a high voltage state signal, or logic 1, when the write_data value has a logic 1 state and a logic 0, or low voltage state signal, when the write_data value has a logic 0 state.

As a result, if the write_data<0:n> values contain more logic 1's than 0's, the non-inverting input, i.e. the "+" input, to the comparator 670 will have a higher voltage than the inverting input, i.e. the "−" input. This will result in the value of the polarity output of the comparator 670 being a logic 1 or high voltage state signal. Conversely, if the write_data<0:n> values contain more logic 0's than logic 1's, the non-inverting input to the comparator 670 will have a lower voltage than the inverting input and, as a result, the comparator 670 will output a logic 0 or low voltage state signal.

This polarity detection scheme has two regions of operation, where the write_data<0:n> has a significant bias towards either logic 0's or logic 1's, i.e. there are a significant number of write_data<0:n> values that are one logic state compared to the other logic state, or there is a negligible bias, i.e. the number of write_data<0:n> values that are either logic state is approximately even. If there is a significant bias, the evaluation of the polarity may be performed quickly. If the bias is negligible, the evaluation of the polarity may be slow or even indeterminate. However, in those cases, a majority write/evaluation scheme would result in minimal power savings.

Figure 7:
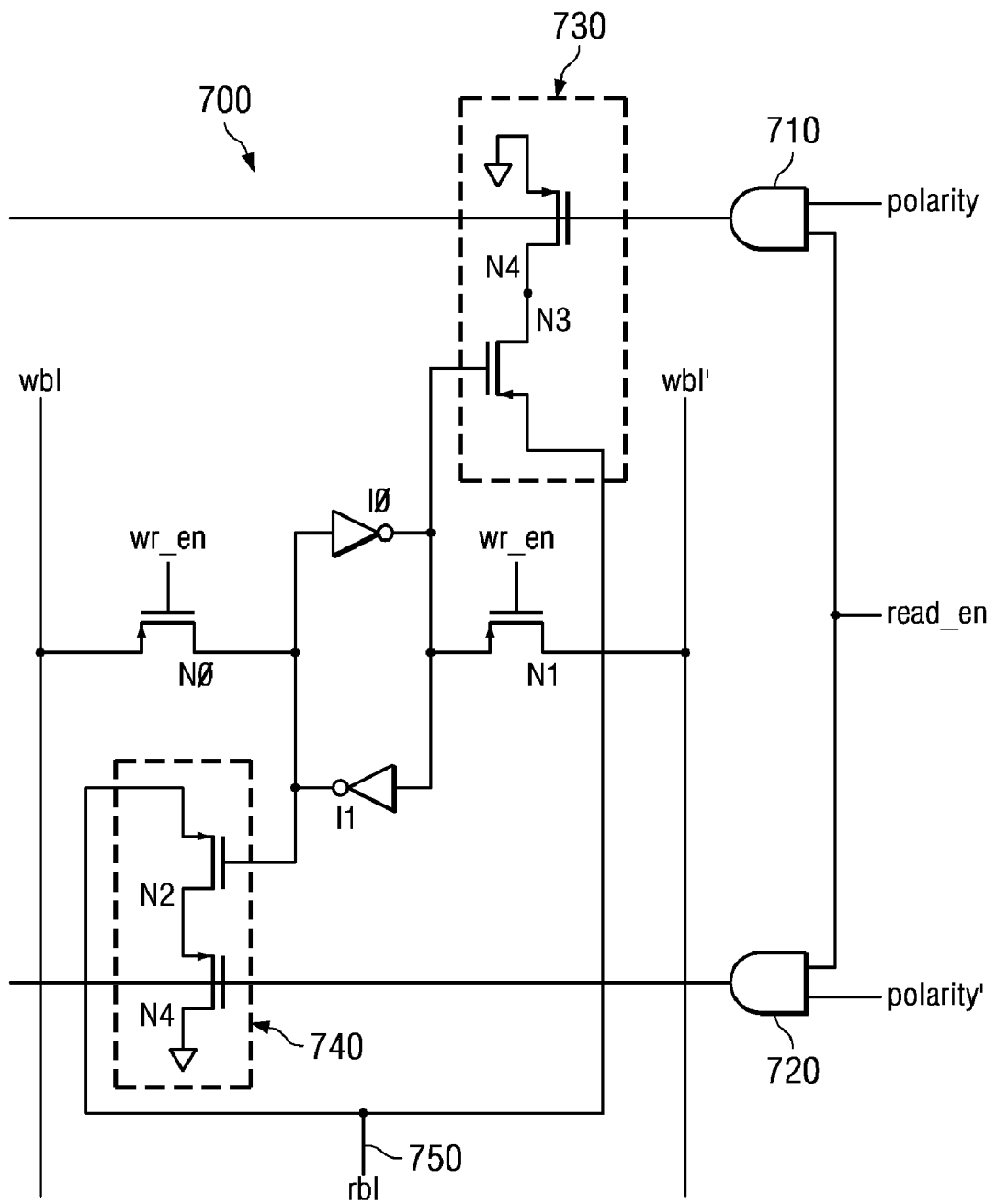
FIG. 7 is an exemplary diagram of circuitry of a SRAM cell in accordance with one illustrative embodiment.

FIG. 7 is an exemplary diagram of circuitry of a SRAM cell in accordance with one illustrative embodiment. As shown in FIG. 7, when compared to a known SRAM cell configuration, the SRAM cell 700 of the illustrative embodiments differs in that it has two polarity inputs comprising AND gates 710 and 720 where the polarity input signal and an inverted polarity input signal from a corresponding polarity cell are AND'd with a read_enable signal. The SRAM cell 700 further includes two read ports, a true read port 730 and an inverted or complement read port 740. Based on the polarity of the row, as specified by the polarity input signal for the polarity cell, the read_enable signal in conjunction with the polarity input signal and inverted polarity input signal determines whether the SRAM cell 700 outputs the true or complement data value onto the SRAM cell's read bit line (RBL) 750.

If the polarity of the row indicates that there are more logic 1's than 0's in the row, i.e. the polarity value is a 1, then the true data value is output to the read bit line 750 via the true read port 730 because the output of the AND gate 710 is a logic 1 or high voltage state signal and the output of the AND gate 720 is a logic 0 or low voltage state signal. If the polarity of the row indicates that there are more logic 0's than 1's in the row, i.e. the polarity value is a 0, then the complement data value is output to the read bit line 750 via the inverted or complement read port 740 because the output of the AND gate 720 is a logic 1 or high voltage state and the output of the AND gate 710 is a logic 0 or low voltage state signal.

Thus, with the mechanisms of the above illustrative embodiments, each SRAM cell has an extra read port. Moreover, circuitry to distribute polarity and polarity' signal and an extra word line driver are utilized to activate the extra read port. These additional elements may be eliminated by providing additional circuitry in the polarity detector itself for determining whether to write the true data value or its complement to the SRAM cells of a row in the SRAM cell array. Thus, by writing either the true data value or its complement to the SRAM cell in the first place, it is not necessary to determine whether to output either the true or complement data value during a read operation using the circuitry shown in FIG. 7.

Figure 8:
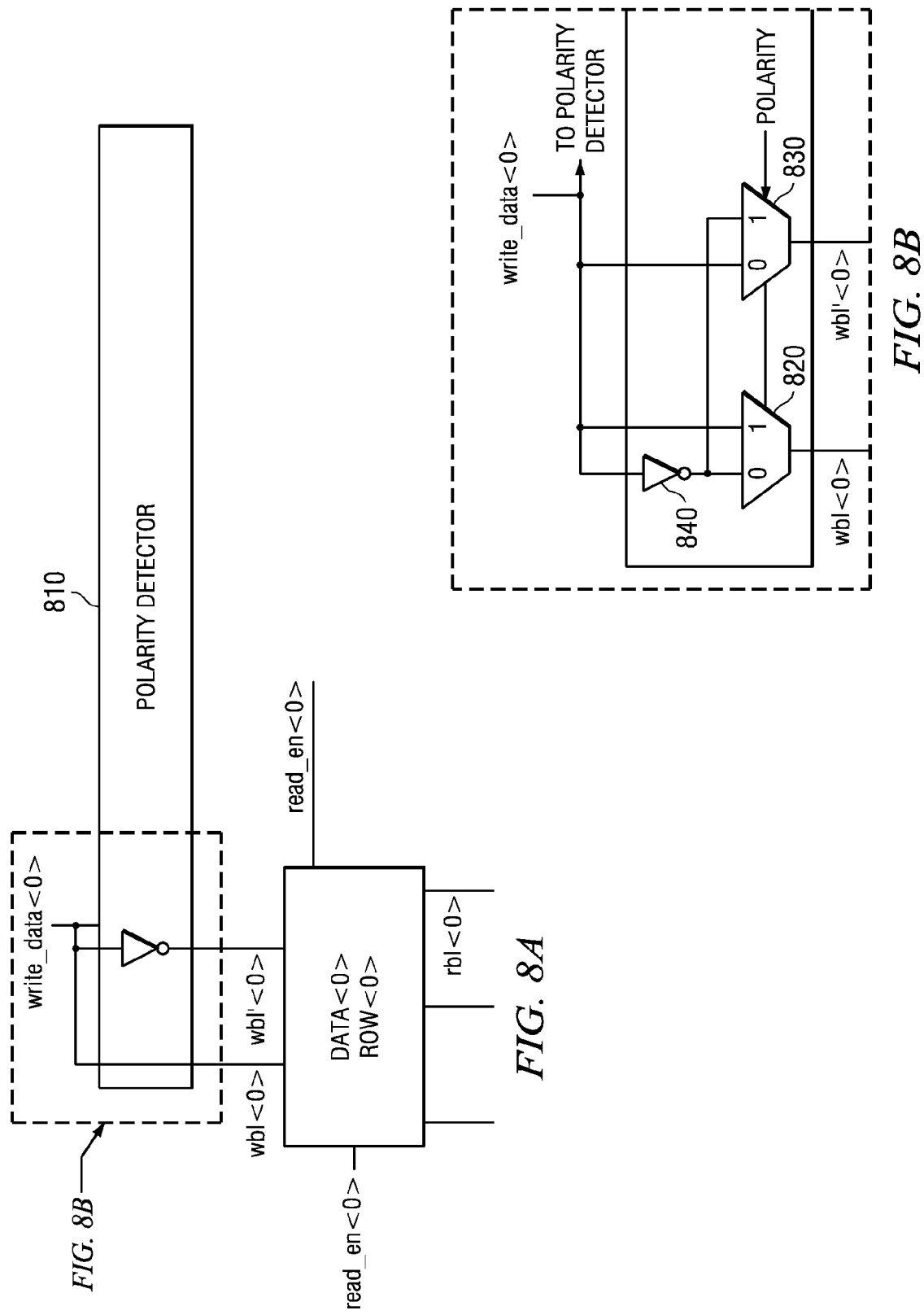
FIGS. 8A-8B are exemplary diagrams of write circuitry for controlling the data value written to an SRAM cell based on a polarity of a row in the SRAM cell array in accordance with one illustrative embodiment.

FIGS. 8A-8B are exemplary diagrams of write circuitry for controlling the data value written to an SRAM cell based on a polarity of a row in the SRAM cell array in accordance with one illustrative embodiment. As shown in FIGS. 8A-8B, the additional circuitry that may be added to the polarity detector 810 includes a pair of multiplexers 820 and 830 and an inverter 840. The outputs of the multiplexers 820 and 830 provide the write bit line signals wbl<0:n> and wbl'<0:n>, respectively, based on the determined polarity of the row of data being written to the SRAM cell array.

With this additional circuitry in the polarity detector, the write_data<0:n> signal is input as a first input to the multiplexer 830 and a second input to the multiplexer 820. The inverted write_data<0:n> signal is input as a second input to the multiplexer 830 and a first input to the multiplexer 820. The polarity of the row, as determined by the polarity detector 810 in the manner previously described, is used as a selector for the multiplexers 820 and 830. Thus, if the polarity of the row is determined to be a logic 0, then the inverted write_data<0:n> value is output by multiplexer 820 as the wbl<0:n> value and the true write_data<0:n> value is output by multiplexer 830 as the wbl'<0:n> value. Conversely, if the polarity of the row is determined to be a logic 1, then the true write_data<0:n> value is output by multiplexer 820 as the wbl<0:n> value and the inverted write_data<0:n> value is output by multiplexer 830 as the wbl'<0:n> value.

As a result, the SRAM cells of the SRAM cell array may be conventional SRAM cells with the addition of the polarity cells 530 and multiplexers 580, 590 per column 524 providing the additional logic for determining whether to output the true or complement of the data value stored in the SRAM cell, as previously described above with regard to FIG. 5.

Figure 9:
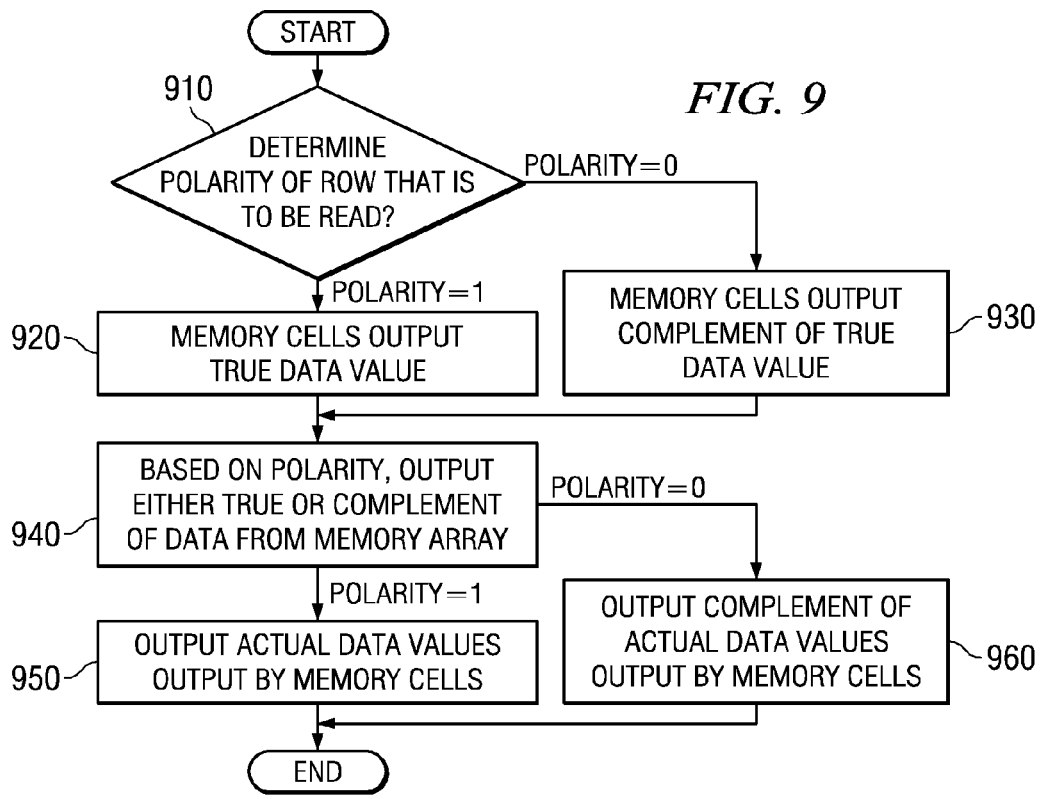
FIG. 9 is a flowchart outlining an exemplary operation for reading data from an SRAM cell array based on a determined polarity of a SRAM cell array row in accordance with one illustrative embodiment.
Figure 10:
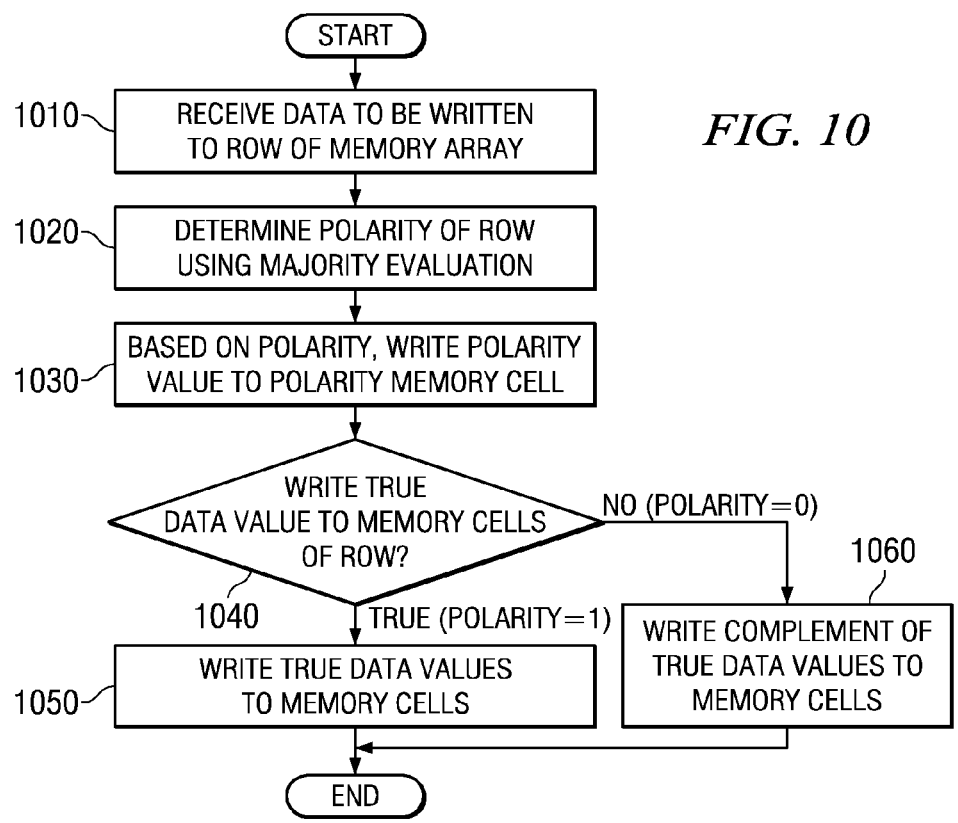
FIG. 10 is a flowchart outlining an exemplary operation for writing data to an SRAM cell array based on a determined polarity of a SRAM cell array row in accordance with one illustrative embodiment.

FIGS. 9-10 are flowcharts outlining exemplary operations of illustrative embodiments of the present invention. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

Furthermore, the flowcharts are provided to demonstrate the operations performed within the illustrative embodiments. The flowcharts are not meant to state or imply limitations with regard to the specific operations or, more particularly, the order of the operations. The operations of the flowcharts may be modified to suit a particular implementation without departing from the spirit and scope of the present invention.

FIG. 9 is a flowchart outlining an exemplary operation for reading data from an SRAM cell array based on a determined polarity of a SRAM cell array row in accordance with one illustrative embodiment. It should be noted that the operation outlined in FIG. 9 assumes that the polarity of a row of data in the SRAM cell array has been determined when the data was written to the SRAM cell array, such as in the manner described above with regard to FIG. 5. Thus, the polarity of the row is stored in a polarity cell associated with the row from which data is to be read.

Furthermore, it should be appreciated that the operations outlined in FIG. 9 assume an illustrative embodiment as set forth in FIGS. 5-7 above. If an embodiment is utilized in which the polarity detector includes additional circuitry for determining whether to write the true or complement value into the SRAM cells, such as shown in FIGS. 8A-8B, steps 910-930 would not be necessary since these steps are essentially performed when the data values are written to the SRAM cells using the circuitry of FIGS. 8A-8B.

As shown in FIG. 9, the operation starts with the SRAM cell array determining a polarity of the row that is to be read (step 910). If the polarity of the row indicates that there are more 1 data values stored in the row than 0 data values, then the SRAM cells of the row output the true data value stored in the respective SRAM cells of the row (step 920). If the polarity of the row indicates that there are more 0 data values stored in the row than 1 data values, then the SRAM cells of the row output the complement of the data values stored in the respective SRAM cells of the row (step 930).

Based on the determined polarity, for each SRAM cell in the row, either the actual output of the SRAM cell or a complement of the output of the SRAM cell is output as the data read from the SRAM cell array for that SRAM cell (step 940). If the polarity is a logic 1, then the actual output of the SRAM cell is output as the output for the SRAM cell array for that SRAM cell (step 950). If the polarity is a logic 0, then the complement of the SRAM cell's output is output as the output of the SRAM cell array for that SRAM cell (step 960). The operation then terminates. This operation may be repeated for each read operation in the SRAM cell array.

FIG. 10 is a flowchart outlining an exemplary operation for writing data to an SRAM cell array based on a determined polarity of a SRAM cell array row in accordance with one illustrative embodiment. The operations outlined in FIG. 10 assume that the polarity detector includes circuitry for determining the polarity of a row of data to be written to the SRAM cell array when the data is being written. Such circuitry may take the form shown in FIGS. 8A-8B, for example.

As shown in FIG. 10, the operation starts with receiving write data to be written to a row in the SRAM cell array (step 1010). The polarity of the row is determined based on a majority evaluation so as to determine whether there are more 1 data values or more 0 data values in the row (step 1020). Based on the determined polarity, a polarity value is written to a polarity cell associated with the row to which the data is to be written (step 1030).

Based on the polarity of the row, a determination is made as to whether the true data value or a complement of the data value is to be written to each SRAM cell of the row (step 1040). If the polarity of the row is a logic 1, then the true data value corresponding to the write data input is written to the SRAM cells of the row (step 1050). If the polarity of the row is a logic 0, then the complement data value corresponding to an inverted write data input is written to the SRAM cells of the row (step 1060). The operation then terminates. It should be appreciated that if the illustrative embodiments of FIGS. 5-7 were utilized in which the determination of whether the true or complement data values are to be output by the SRAM cells is performed during the read operation rather than at the write operation, then steps 1040-1060 would not be necessary and would in fact be performed with each read operation as outlined above in FIG. 9.

Figure 13:
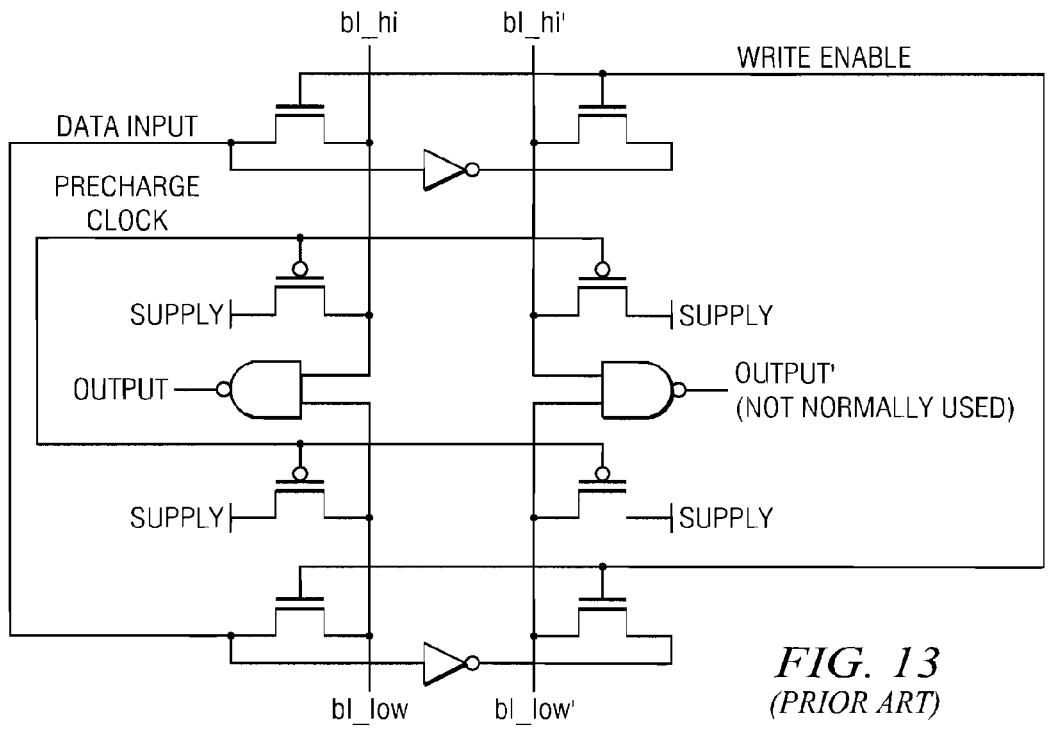
FIG. 13 is an exemplary diagram of a known precharge circuit for use with the known 6T SRAM cell configuration of FIG. 11.
Figure 14:
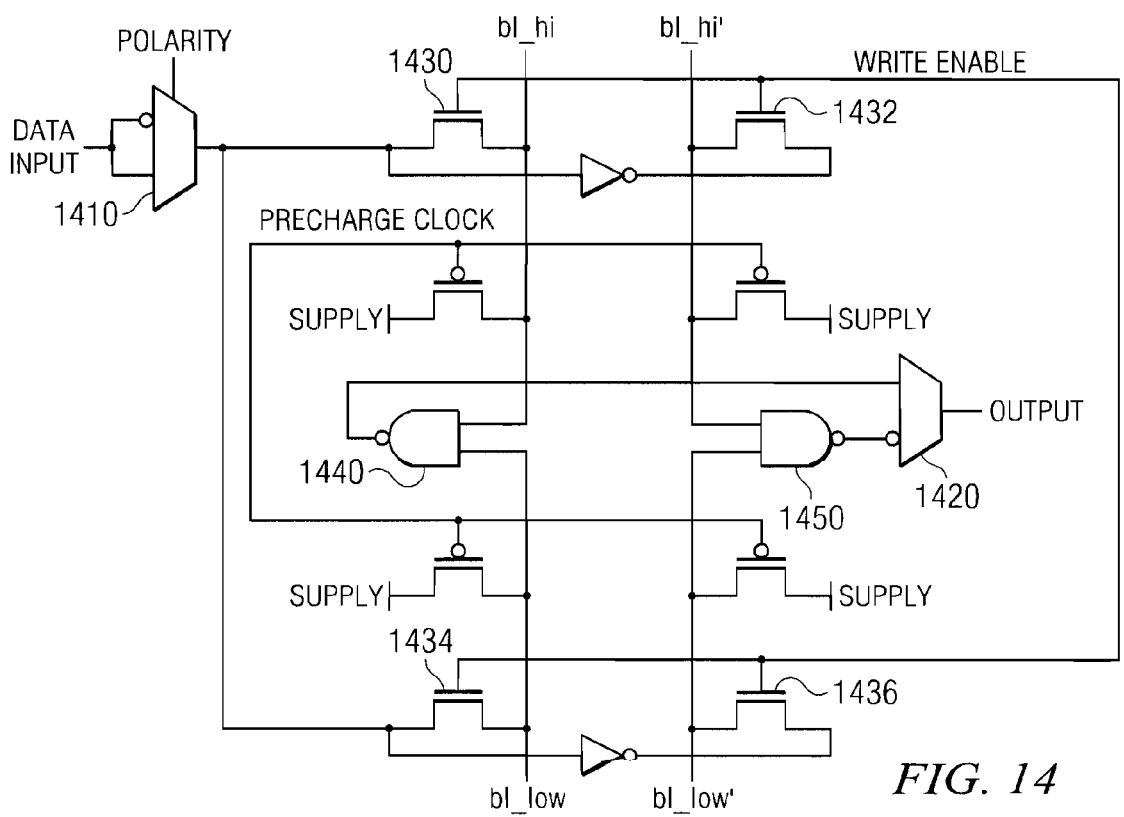
FIG. 14 is an exemplary diagram of a precharge circuit for use with the 6T SRAM cell configuration of FIG. 12 in accordance with one illustrative embodiment.

The above illustrative embodiments are described with regard to an 8T SRAM cell. It should be appreciated that the illustrative embodiments are not limited to an 8T SRAM cell and may be used with other SRAM cell configurations without departing from the spirit and scope of the present invention. For example, the mechanisms of the illustrative embodiments may be utilized with 6T SRAM cells as well. To illustrate the differences between conventional 6T SRAM cell configurations and a 6T SRAM cell configuration that utilizes the mechanisms of the illustrative embodiments, FIGS. 11 and 13 are provided as an example of a known 6T SRAM cell configuration and FIGS. 12 and 14 are provided as examples of an implementation of an illustrative embodiment of the present invention in a 6T SRAM cell configuration.

Figure 1:
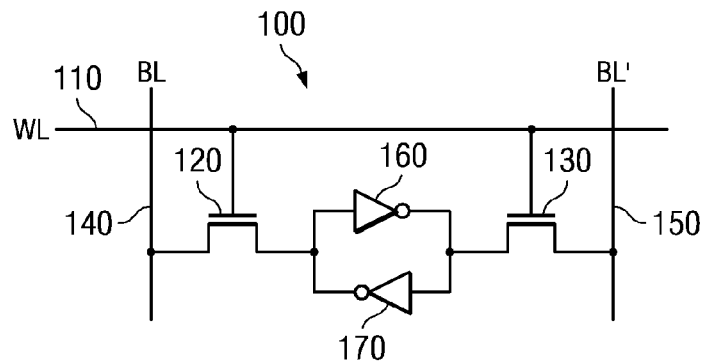
FIG. 1 is an exemplary diagram of a known six transistor (6T) SRAM cell.
Figure 2:
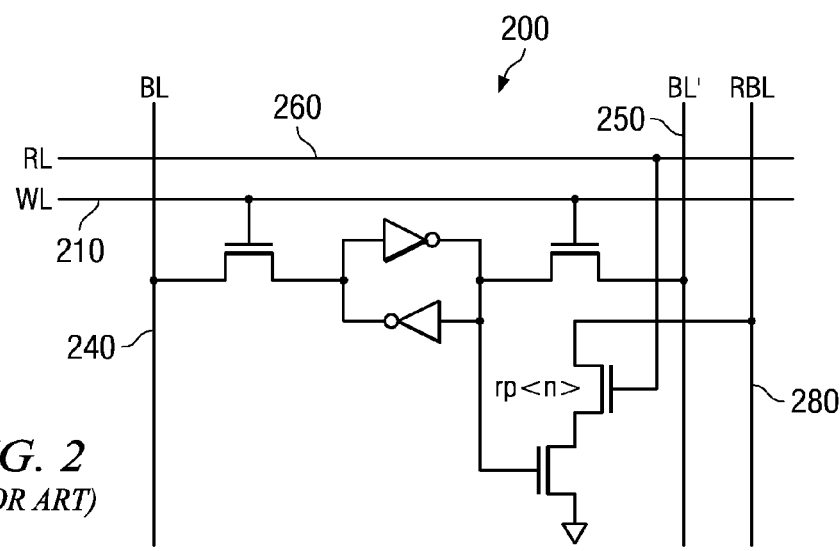
FIG. 2 is an exemplary diagram of another known SRAM cell architecture that makes use of eight transistors, i.e. an 8T SRAM cell.
Figure 11:
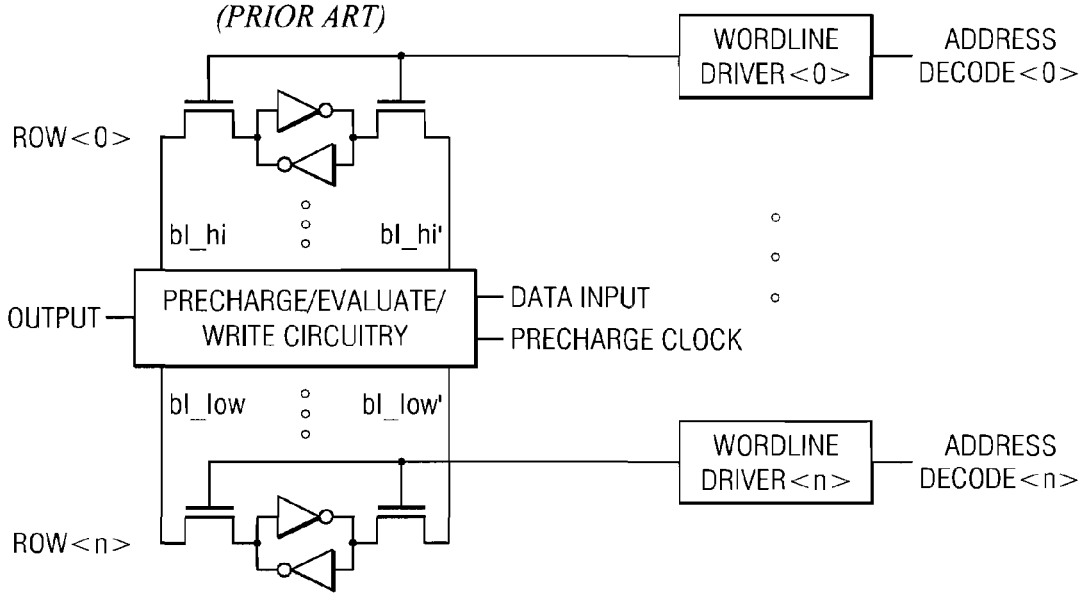
FIG. 11 is an exemplary diagram of a known 6T SRAM cell configuration.

FIG. 11 is an exemplary diagram of a known 6T SRAM cell configuration. The configuration shown in FIG. 11 is essentially the same as that shown in FIG. 1. The important feature to note with regard to FIG. 11 is that the known 6T SRAM cell configuration does not contain any logic for determining whether to output the true data value stored in the SRAM cell or the complement of the true data value. The known 6T cell configuration is only capable of outputting the true data values stored in the SRAM cells. Thus, there is no ability to perform majority evaluation, as in the illustrative embodiments.

Figure 12:
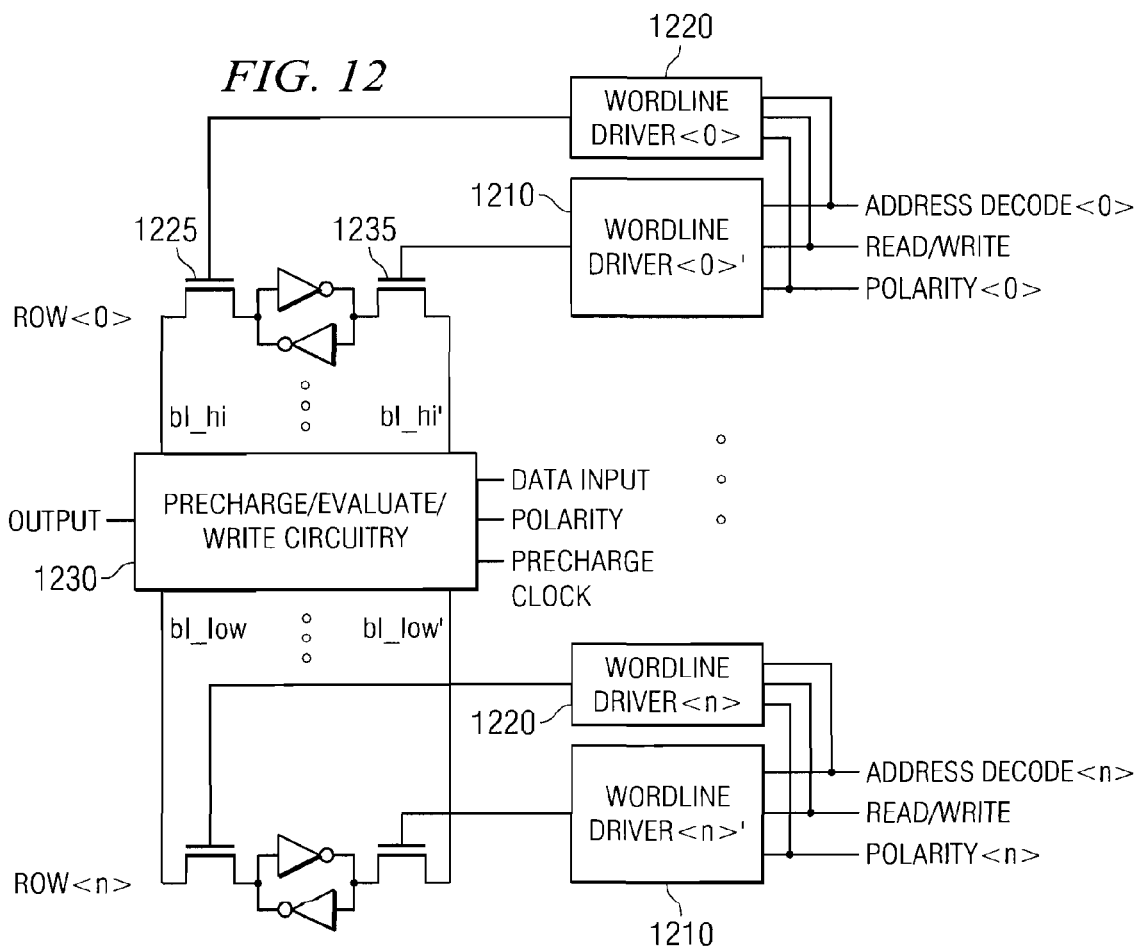
FIG. 12 is an exemplary diagram of a 6T SRAM cell configuration in accordance with one illustrative embodiment.

FIG. 12 is an exemplary diagram of a 6T SRAM cell configuration in accordance with one illustrative embodiment. As shown in FIG. 12, the primary differences between the known 6T SRAM cell and the 6T SRAM cell implementing the mechanisms of the illustrative embodiment is the inclusion of a complement wordline driver 1210 for each wordline, the input of the address decode signal, read/write signal, and polarity signal to the wordline driver 1220 and the complement wordline driver 1210, and the input of the polarity signal into the precharge/evaluate/write circuitry 1230. The wordline driver 1220 is coupled to only one transistor 1225 of the SRAM cell that is coupled to the bit line bl_hi, as opposed to both transistors, as in the known SRAM cell configuration shown in FIG. 11. The complement wordline driver 1210 is coupled to the other transistor 1235 coupled to the complement bit line bl_hi'.

Based on the polarity value indicated by the polarity signal input to the wordline driver 1220 and the complement wordline driver 1210, either the wordline signal or the complement wordline signal is asserted to the transistors 1225 and 1235, respectively, to thereby activate the transistors 1225 and 1235. Based on whether the transistor 1225 or transistor 1235 is left at a precharged high level, based on the asserted wordline or complement wordline signal, either the true data value stored in the SRAM cell or its complement is output via the precharge/evaluate/write circuitry 1230.

FIG. 13 is an exemplary diagram of a known precharge/evaluate/write circuit for use with the known 6T SRAM cell configuration of FIG. 11. FIG. 14 is an exemplary diagram of a precharge/evaluate/write circuit for use with the 6T SRAM cell configuration of FIG. 12 in accordance with one illustrative embodiment. As is clear from a comparison of FIGS. 13 and 14, the primary differences between the known precharge/evaluate/write circuit shown in FIG. 13 and the precharge/evaluate/write circuitry of the illustrative embodiment shown in FIG. 14 is the inclusion of multiplexers 1410 and 1420.

The data input signal and the inverted data input signal is input to the multiplexer 1410 with the polarity signal being a select signal to the multiplexer 1410. Based on the polarity of the row of SRAM cells, either the inverted data input signal or the data input signal is selected for assertion to the transistors 1430-1436. The multiplexer 1420 outputs either the output of the NAND gate 1440 or the complement of the inverted output from NAND gate 1450 as the output of the precharge/evaluate/write circuitry. With the above circuitry, the majority evaluation and polarity based operation of the mechanisms of the illustrative embodiments may be applied to 6T SRAM cells as well as the 8T SRAM cells previously described above.

Thus, the illustrative embodiments provide a mechanism for minimizing power consumption in an SRAM cell array, such as may be used in memories, caches, and the like, of a data processing device, integrated circuit device, data processing system, or the like. The illustrative embodiments minimize power consumption by minimizing the number of discharges of read bit lines in the SRAM cell array when performing read operations. The minimization of discharges is made possible by circuitry for determining a majority polarity of the data values stored in a row of the SRAM cell array and using that determined polarity to determine whether reading the true data values or complement data values would result in a lower number of read bit lines that must be discharged.

The circuitry as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory array, comprising:
    a plurality of memory cells arranged in an array configuration having at least one row of memory cells;
    logic that identifies a polarity of a row of memory cells whose data values are to be read from the memory array to generate a polarity signal, wherein the polarity of the row of memory cells indicates whether a majority of the data values stored in the row of memory cells are logic 1 data values or logic 0 data values, wherein if the polarity of the row of memory cells indicates that a majority of the data values stored in the row of memory cells are logic 1 data values, then the selection logic selects the true data values of the memory cells in the row of memory cells for output by the memory array, wherein if the polarity of the row of memory cells indicates that a majority of the data values stored in the row of memory cells are logic 0 data values, then the selection logic selects the complement data values of the memory cells in the row of memory cells for output by the memory array;

selection logic that selects whether to output true data values from the memory cells of the row of memory cells or complement data values from the memory cells of the row of memory cells based on the identified polarity; and output logic that outputs one of the true data values or the complement data values from the memory cells of the row of memory cells as the data read from the memory array based on the selection, wherein each of the plurality of memory cells comprises:
a first AND gate that combines the polarity signal and a read enable signal to form a first polarized read enable signal;
a true read port that receives the first polarized read enable signal and outputs a true data value to a read bit line if the first polarized read enable signal is asserted;
a second AND gate that combines a compliment of the polarity signal and the read enable signal to form a second polarized read enable signal; and
a compliment read port that receives the second polarized read enable signal and outputs a compliment data value to the read bit line if the second polarized read enable signal is asserted.

2. The memory array of claim 1, further comprising:
logic that receives data values to be written to the row of memory cells;
polarity detection logic that determines a polarity value of the row of memory cells based on the data values to be written to the row of memory cells; and
logic that stores the polarity value in association with the row of memory cells, wherein the polarity value is used to identify the polarity of the row of memory cells.

3. The memory array of claim 1, wherein memory cells in the memory array are static random access memory (SRAM) cells.

4. The memory array of claim 1, further comprising:
logic that receives data values to be written to the row of memory cells;
polarity detection logic that detects a polarity value of the row of memory cells based on the data values to be written to the row of memory cells;
determination logic that determines whether to write the data values or complement data values to the row of memory cells based on the polarity value; and
write logic that writes one of the data values or the complement data values to the row of memory cells based on results of the determination.

5. The memory array of claim 4, wherein the selection logic selects whether to output true data values from the memory cells of the row of memory cells or complement data values from the memory cells of the row of memory cells based on the identified polarity by selecting whether to output an actual data value output by the memory cells or a complement of the actual data value output by the memory cells based on the identified polarity of the row of memory cells, wherein the actual data value or the complement of the actual data value may be the true data value based on whether true data values or complements of the true data values are written to the memory cells.

6. The memory array of claim 4, wherein the polarity detection logic comprises:
a comparator;
a first set of inverters, wherein each inverter within the first set of inverters is connected to a corresponding write data line for the row of memory cells, wherein outputs of the first set of inverters are connected in series to generate a first reference voltage and wherein the first reference voltage is received at a first input of the comparator; and
a second set of inverters, wherein each inverter within the second set of inverters is connected to a corresponding inverted write data line for the row of memory cells, wherein outputs of the second set of inverters are connected in series to generate a second reference voltage and wherein the second reference voltage is received at a second input of the comparator,
wherein the comparator generates the polarity signal based on whether the second reference voltage is higher than the first reference voltage.

7. A data processing device, comprising:
a processor; and
a memory coupled to the processor, wherein the memory comprises a plurality of memory cells including at least one row of memory cells, and wherein the memory comprises logic that:
identifies a polarity of a row of memory cells whose data values are to be read from the memory array to generate a polarity signal, wherein the polarity of the row of memory cells indicates whether a majority of the data values stored in the row of memory cells are logic 1 data values or logic 0 data values, wherein if the polarity of the row of memory cells indicates that a majority of the data values stored in the row of memory cells are logic 1 data values, then the selection logic selects the true data values of the memory cells in the row of memory cells for output by the memory array, wherein if the polarity of the row of memory cells indicates that a majority of the data values stored in the row of memory cells are logic 0 data values, then the selection logic selects the complement data values of the memory cells in the row of memory cells for output by the memory array;
selects whether to output true data values from the memory cells of the row of memory cells or complement data values from the memory cells of the row of memory cells based on the identified polarity; and
outputs one of the true data values or the complement data values from the memory cells of the row of memory cells as the data read from the memory array based on the selection,
wherein each of the plurality of memory cells comprises:
a first AND gate that combines the polarity signal and a read enable signal to form a first polarized read enable signal;
a true read port that receives the first polarized read enable signal and outputs a true data value to a read bit line if the first polarized read enable signal
a second AND gate that combines a compliment of the polarity signal and the read enable signal to form a second polarized read enable signal; and
a compliment read port that receives the second polarized read enable signal and outputs a compliment data value to the read bit line if the second polarized read enable signal is asserted.

8. The data processing device of claim 7, wherein the memory comprises:

logic that receives data values to be written to the row of memory cells;

polarity detection logic that determines a polarity value of the row of memory cells based on the data values to be written to the row of memory cells; and logic that stores the polarity value in association with the row of memory cells, wherein the polarity value is used to identify the polarity of the row of memory cells.

9. The data processing device of claim 7, wherein the plurality of memory cells are static random access memory (SRAM) cells.

10. The data processing device of claim 7, wherein the memory comprises:

logic that receives data values to be written to the row of memory cells;

polarity detection logic that detects a polarity value of the row of memory cells based on the data values to be written to the row of memory cells;

determination logic that determines whether to write the data values or complement data values to the row of memory cells based on the polarity value; and write logic that writes one of the data values or the complement data values to the row of memory cells based on results of the determination.

11. The data processing device of claim 10, wherein the selection logic selects whether to output true data values from the memory cells of the row of memory cells or complement data values from the memory cells of the row of memory cells based on the identified polarity by selecting whether to output an actual data value output by the memory cells or a complement of the actual data value output by the memory cells based on the identified polarity of the row of memory cells, wherein the actual data value or the complement of the actual data value may be the true data value based on whether true data values or complements of the true data values are written to the memory cells.

12. The data processing device of claim 10, wherein the polarity detection logic comprises:

a comparator;

a first set of inverters, wherein each inverter within the first set of inverters is connected to a corresponding write data line for the row of memory cells, wherein outputs of the first set of inverters are connected in series to generate a first reference voltage and wherein the first reference voltage is received at a first input of the comparator; and a second set of inverters, wherein each inverter within the second set of inverters is connected to a corresponding inverted write data line for the row of memory cells, wherein outputs of the second set of inverters are connected in series to generate a second reference voltage and wherein the second reference voltage is received at a second input of the comparator, wherein the comparator generates the polarity signal based on whether the second reference voltage is higher than the first reference voltage.

* * * * *